US012610540B2

(12) United States Patent
Peng

(10) Patent No.: US 12,610,540 B2
(45) Date of Patent: Apr. 21, 2026

(54) METHODS OF MANUFACTURING 3D PROGRAMMABLE MEMORY DEVICES

(71) Applicant: CHENGDU PBM TECHNOLOGY LTD., Chengdu (CN)

(72) Inventor: Jack Zezhong Peng, San Jose, CA (US)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 1095 days.

(21) Appl. No.: 17/920,812

(22) PCT Filed: Sep. 12, 2019

(86) PCT No.: PCT/CN2019/105516
§ 371 (c)(1),
(2) Date: Oct. 24, 2022

(87) PCT Pub. No.: WO2020/063358
PCT Pub. Date: Apr. 2, 2020

(65) Prior Publication Data
US 2023/0171955 A1 Jun. 1, 2023

(30) Foreign Application Priority Data
Sep. 25, 2018 (CN) .......................... 201811117240.4

(51) Int. Cl.
*H10B 20/25* (2023.01)
(52) U.S. Cl.
CPC ................................... *H10B 20/25* (2023.02)
(58) Field of Classification Search
CPC ........ H10B 43/20; H10B 20/25; H10B 53/20; H10B 63/845; H10B 99/16; H10B 69/00; H10B 51/50; H10B 43/50
See application file for complete search history.

(56) References Cited

U.S. PATENT DOCUMENTS 8,426,294 B2 * 4/2013 Lung ................. G11C 16/0458
438/257
8,829,646 B2 * 9/2014 Lung ..................... H10B 20/00
257/530
(Continued)

FOREIGN PATENT DOCUMENTS

CN 101447502 A 6/2009
CN 101615656 A 12/2009
(Continued)

OTHER PUBLICATIONS

English Machine Translation of CN 106910743 A (Year: 2017).*

*Primary Examiner* — Yara B Green
*Assistant Examiner* — Erika H Son
(74) *Attorney, Agent, or Firm* — Bayramoglu Law Offices LLC

(57) ABSTRACT

A fabrication method of three-dimensional programmable memory includes: 1) forming a base structure; 2) trenching the base structure; 3) setting the preset memory structure layer by layer onto the inner wall of strip trench; 4) filling the core medium in the cavity of the strip trench to form core medium layer; 5) setting the isolation trenches and isolation trench holes to isolate the left-right fingers and memory units, respectively, where the isolation trenches encroach at least one memory medium layer at the strip trench, and form a curve by connecting with the strip trenches from end to end. The isolation holes are set at the strip trenches to divide the strip into at least three independent memory bodies and encroach the medium layers of the base structure near the long sides of the strip trenches; and 6) filling the isolation trenches and holes with insulating medium.

10 Claims, 6 Drawing Sheets

(56)           References Cited

U.S. PATENT DOCUMENTS

| | | | |
|---|---|---|---|
| 10,482,976 B2 * | 11/2019 | Oh ......................... | H01S 5/1071 |
| 10,700,086 B2 * | 6/2020 | Makala .................. | H10B 41/35 |
| 2012/0208347 A1 * | 8/2012 | Hwang ................. | H01L 21/762 |
| | | | 257/E21.546 |
| 2015/0104916 A1 | 4/2015 | Lee et al. | |
| 2018/0268235 A1 * | 9/2018 | Zhang .................. | G06F 21/566 |
| 2019/0214403 A1 * | 7/2019 | Oike ...................... | H10B 43/50 |

FOREIGN PATENT DOCUMENTS

| | | | | |
|---|---|---|---|---|
| CN | 101626023 A | | 1/2010 | |
| CN | 101901809 A | | 12/2010 | |
| CN | 103022348 A | | 4/2013 | |
| CN | 106910743 A | * | 6/2017 | ............ H10B 43/20 |
| CN | 108461517 A | | 8/2018 | |
| CN | 109545787 A | | 3/2019 | |

* cited by examiner

51

61

METHODS OF MANUFACTURING 3D PROGRAMMABLE MEMORY DEVICES

CROSS REFERENCES TO THE RELATED APPLICATIONS

The application is the national phase entry of International Application No. PCT/CN2019/105516, filed on Sep. 12, 2019, which is based on and claims priority on Chinese patent application No. 201811117240.4, filed on Sep. 25, 2018, the entire contents of which are incorporated herein by reference.

TECHNICAL FIELD

The present invention relates generally to methods of manufacturing semiconductor memory devices, and more particularly, to methods of manufacturing 3D programmable memory devices.

BACKGROUND

Various digital memory technologies including erasable programmable read-only memory (EPROM), electrically erasable programmable read-only memory (EEPROM), flash memory, NAND-flash memory, hard disk, compact disk (CD), digital versatile disk (DVD), and Blu-ray Discs registered by the Blu-ray Disc Association, have been widely used for data memory for more than 50 years. However, the lifetime of the memory media is usually less than 5 to 10 years. The anti-fuse memory technology developed for big data memory cannot meet the demand for massive data memory because of its high cost and low memory density.

SUMMARY

The technical problem to be solved by the present invention is to provide a method for preparing a three-dimensional programmable memory with the characteristics of high density and low cost.

The manufacturing method of the three-dimensional programmable memory includes the following steps:

1) Forming a basic structure: set a predetermined number of conductive medium layers and insulating medium layers in a way that the conductive medium layer and the insulating medium layer are vertically stacked one onto another to form the base structure body;

2) Trenching the base structure: at least three strip trenches through from the top to the bottom of the base structure body are independent and parallel from one to another, and the adjacent sides of strip trenches are the long sides of the strip trenches.

3) On the inner wall of the strip trench, the memory medium layers determined by the preset memory structure being deposited layer by layer;

4) Filling the core medium in the cavity of the strip trench to form a core medium layer;

5) Setting the isolation trenches and isolation trench holes to isolate the left and right fingers and memory units, respectively, from the top layer to the bottom: the isolation trenches should encroach at least one memory medium layer at the strip trench. The isolation trenches together with the strip trenches should be connected from end to end to form a curve. The isolation trench holes should be set at the strip trenches to divide the strip into at least three independent memory bodies, and encroach the base structure media near the long sides of the strip trench;

6) Filling the isolation trenches and isolation trench holes with insulating medium;

In step 3), the preset memory structure is one of the following structures:

PN junction semiconductor memory structure, Schottky semiconductor memory structure, resistance change memory structure, magnetic phase change memory structure, phase change memory structure, ferroelectric memory structure.

Further, the isolation trench encroaches into the first layer of medium deposited on the inner wall of the strip trench.

The strip trench and the isolation trench hole is rectangular from top view, and the long side of the isolation trench hole is perpendicular to the long side of the strip trench.

The beneficial effects of the present invention are that the prepared semiconductor memory has high memory density, low process cost, being easy to fabricate.

The present invention has the following characteristics:

1. The multi-layer 2bits OTP memory unit is formed by deep trench media isolation.

2. Only two steps of deep trench etching and filling are needed, and the isolation of the memory units and left-right fingers is accomplished in one step.

3. The diameter of the self-aligning rectangular deep trench hole to isolate the memory units can be the latest minimal size to achieve the highest memory density.

4. The process is relatively easy to control.

DETAILED DESCRIPTION OF THE EMBODIMENTS

The fabricating method of three-dimensional programmable memory includes the following steps:

1) Forming a basic structure: set a predetermined number of conductive medium layers and insulating medium layers in a way that the conductive medium layer and the insulating medium layer are vertically stacked one onto another to form the base structure body;

2) Trenching the base structure: at least three strip trenches through from the top to the bottom of the base structure body are independent and parallel from one to another, and the adjacent sides of strip trenches are the long sides of the strip trenches.

3) On the inner wall of the strip trench, the memory medium layers determined by the preset memory structure being deposited layer by layer;

4) Filling the core medium in the cavity of the strip trench to form a core medium layer;

5) Setting the isolation trenches and isolation trench holes to isolate the left and right fingers and memory units, respectively, from the top layer to the bottom: the isolation trenches should encroach at least one memory medium layer at the strip trench. The isolation trenches together with the strip trenches should be connected from end to end to form a curve. The isolation trench holes should be set at the strip trenches to divide the strip into at least three independent memory body, and should encroach the base structure media near the long sides of the strip trenches;

6) Filling the isolation trenches and isolation trench holes with insulating medium;

In step 3), the preset memory structure is one of the following structures:

PN junction semiconductor memory structure, Schottky semiconductor memory structure, resistive memory structure, magnetic phase change memory structure, phase change memory structure, ferroelectric memory structure.

Figure 11:
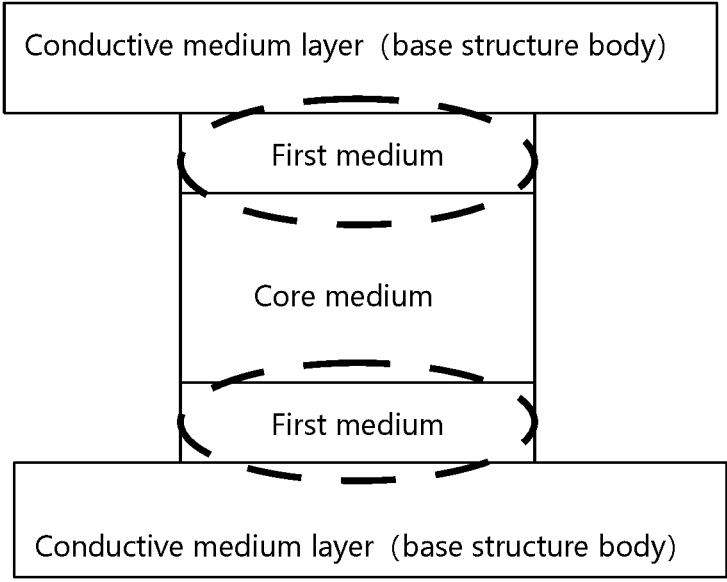
FIG. 11 is a schematic diagram of the memory structure of the third embodiment.

Taking the PN junction semiconductor memory structure of the embodiment shown in FIG. 11 as an example, it includes a P-type conductive region, an N-type conductive region, and an insulating dielectric region arranged between the two. The configuration of "P-type conductive area/ insulating dielectric area/N-type conductive area" is grown layer by layer. When the conductive medium layer of the base structure itself adopts P-type conductive material, there is no need to set the P-type semiconductor again, and the core medium is correspondingly an N-type semiconductor. In the fabrication process of this embodiment, in the step:

"3) On the inner wall of the strip trench, the memory medium layers determined by the preset memory structure are deposited layer by layer", the memory medium layer here indicates the insulating medium layer.

Figure 9:
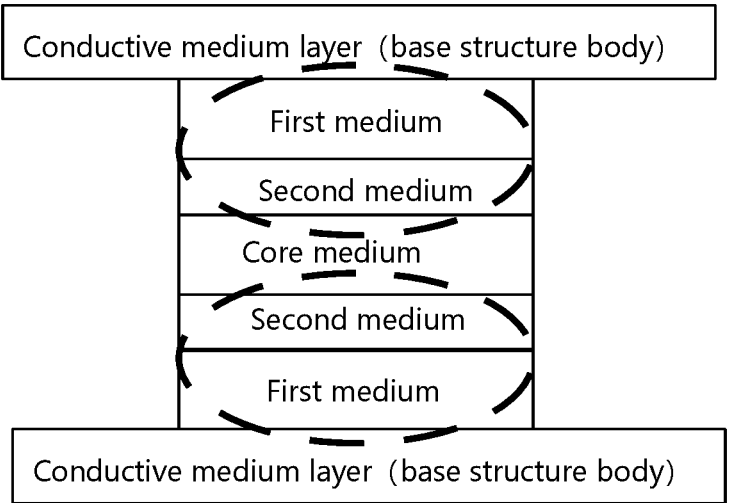
FIG. 9 is a schematic diagram of a 3-layer structure memory.

For the three-layer medium structure in the strip trench shown in FIG. 9, "the memory medium layers required by the preset memory structure" refer to the first medium layer and the second medium layer.

That is, the memory medium layers disposed in the strip trench may be part of all the structural layers constituting the memory, or it may also be all the structural layers constituting the memory, which is determined by the types of material of the conductive medium layer in the base structure and the material of the core medium layer. For example, if the material of the conductive medium layer and the material of the core medium layer are both conductors (such as low-resistance polysilicon), all layers of the memory structure need to be deposited layer by layer on the trench wall, and the conductive medium layer and the core medium layer only serve as wires.

The first implementation: deposition/filling of 3 medium layers. See FIGS. 1-8.

Figure 1:
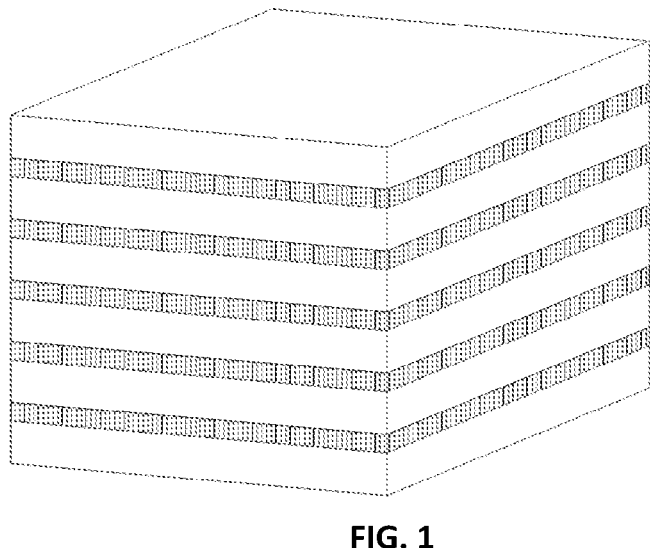
FIG. 1 is a three-dimensional schematic diagram of the formation of the base structure body in Step 1 of the present invention.
Figure 2:
FIG. 2 is a schematic top view of the base structure body in Step 1 of the present invention.

The present invention provides a method for preparing a three-dimensional programmable memory, which includes the following steps:

1) Forming a base structure: a conductive dielectric layer (low-resistance semiconductor or conductor material) and an insulating dielectric layer are vertically stacked one onto another (by deposition process, for example), in such a way that a predetermined number of conductive medium layers and insulating dielectric layers forms the base structure, as shown in FIGS. 1 and 2, and FIG. 2 is the top view of FIG. 1.

Figure 3:
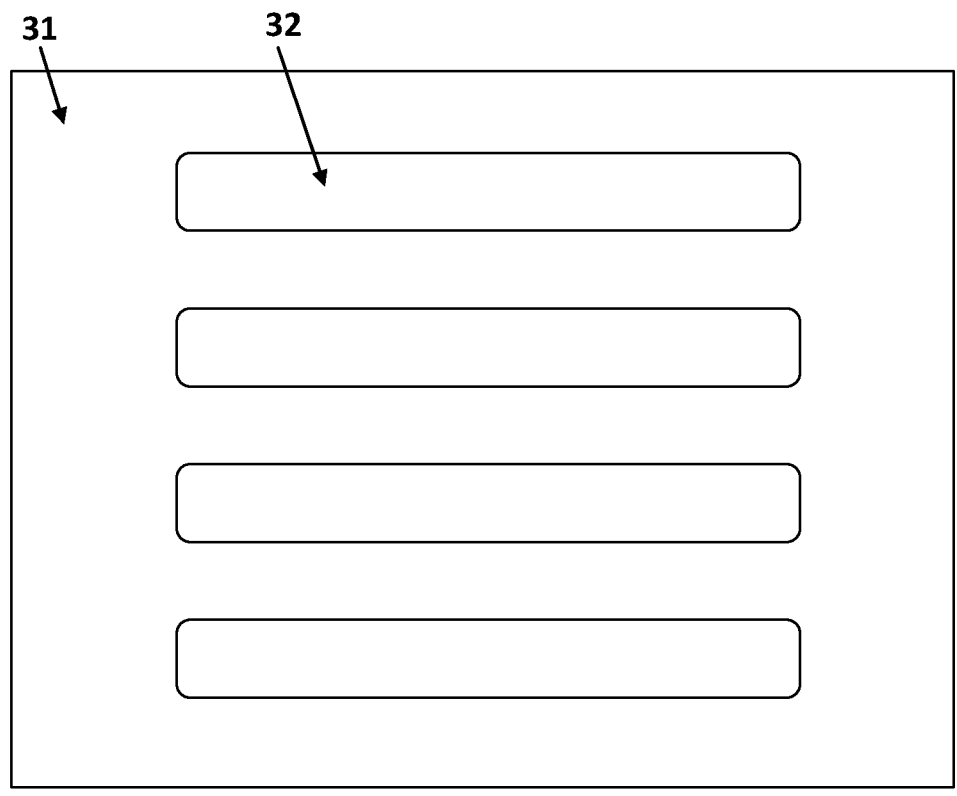
FIG. 3 is a schematic diagram of Step 2 of the first embodiment of the present invention.
Figure 4:
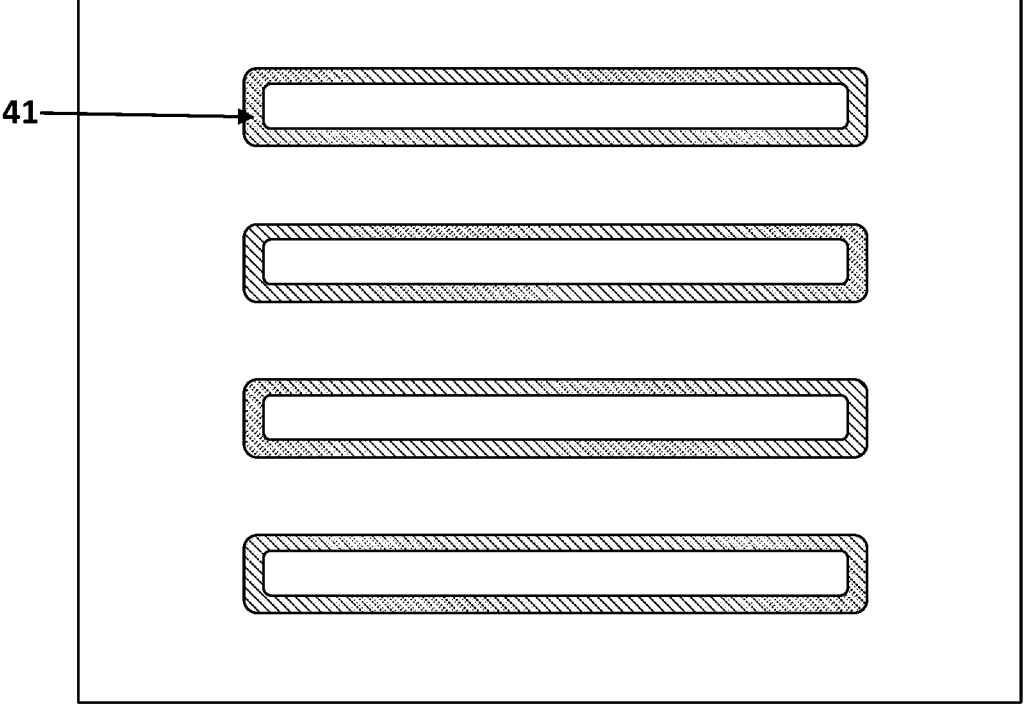
FIG. 4 is a schematic diagram of Step 3 of the first embodiment of the present invention.
Figure 5:
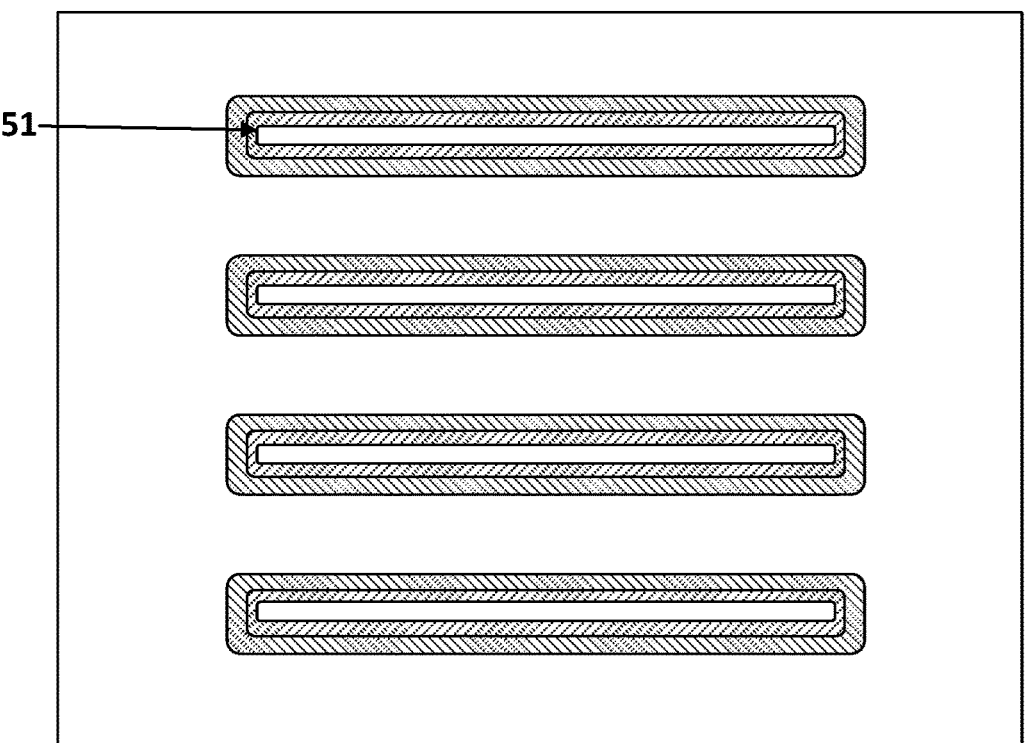
FIG. 5 is a schematic diagram of Step 4 of the first embodiment of the present invention.
Figure 6:
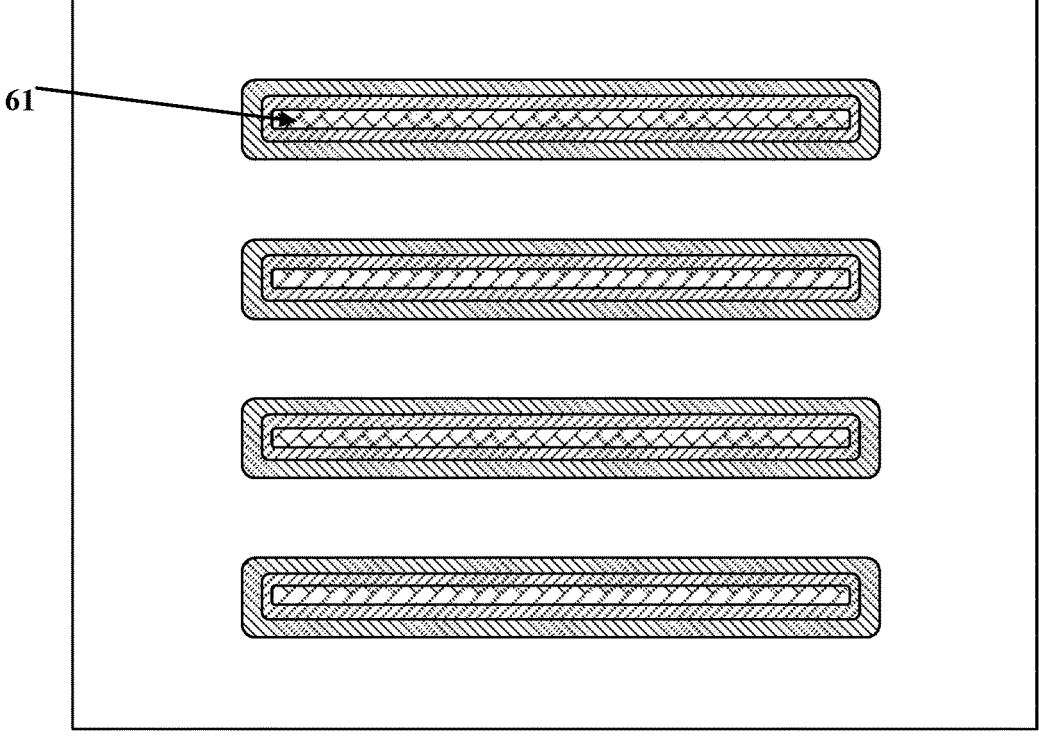
FIG. 6 is a schematic diagram of Step 5 of the first embodiment of the present invention.
Figure 7:
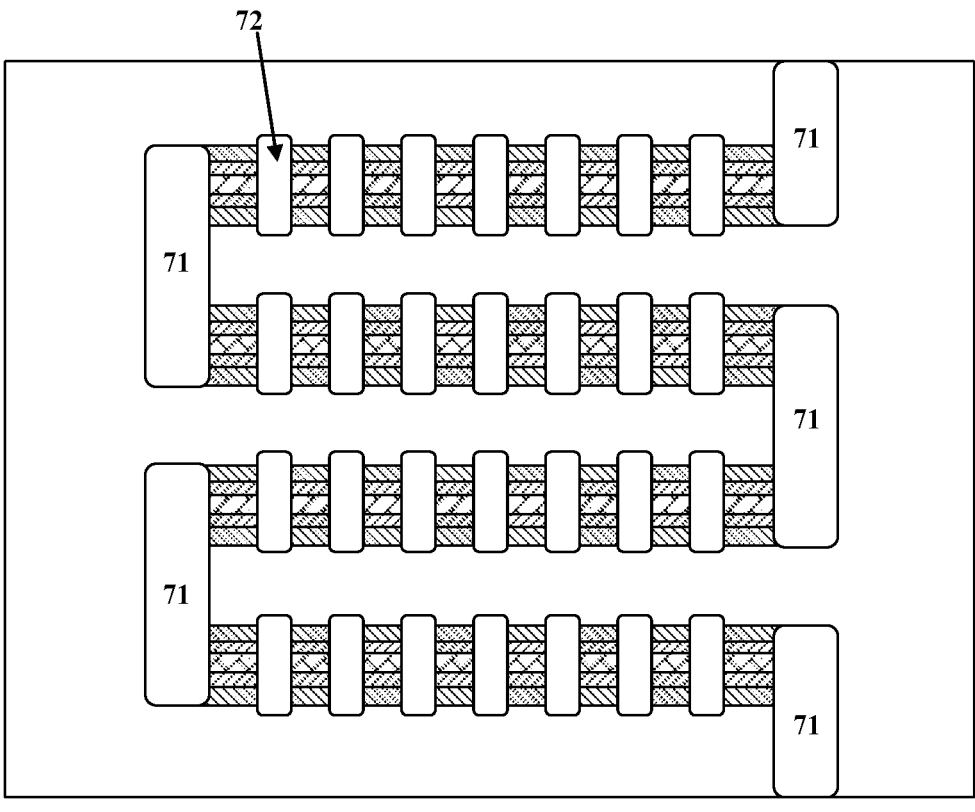
FIG. 7 is a schematic diagram of Step 6 of the first embodiment of the present invention.

2) Trenching the base structure: using a mask definition and deep well etching process, at least 3 parallel strip trenches 32 are etched from the top layer to the bottom layer of the base structure. Each isolation trench is independent of another. The adjacent sides of the two strip trenches are the long sides of the strip-shaped trenches, as shown in FIG. 3, where 31 is a low-resistance semiconductor or conductive material;

3) Using the ALD process, deposit the first dielectric layer 41 on the inner wall of the strip trench, as shown in FIG. 4;

4) Using the ALD process, deposit the second medium layer 51 on the surface of the first medium layer 41, as shown in FIG. 5;

5) Filling the cavity of the strip trenches with the first medium layer and the second medium layer to form a core dielectric layer 61, as shown in FIG. 6;

6) Using a mask definition and deep trench etching process, an isolation trench 71 from the top layer to the bottom layer being set at the two ends of the strip trench, where the isolation trench 71 encroaches the first medium layer and the core medium of the strip trench to ensure that the conductive media near the two sides of the trenches are completely insulated and isolated, and from top view each strip-shaped trench is connected by the isolation trench to form a curve from end to end; the strip trench 32 being divided into at least three independent memory units by the isolation trench holes 72 from the top layer to the bottom layer where the isolation trench holes 72 should encroach the base structure media near the long sides of the strip trench 32, as shown in FIG. 7. The isolation trenches 71 and the isolation trench holes 72 are achieved simultaneously.

Figure 8:
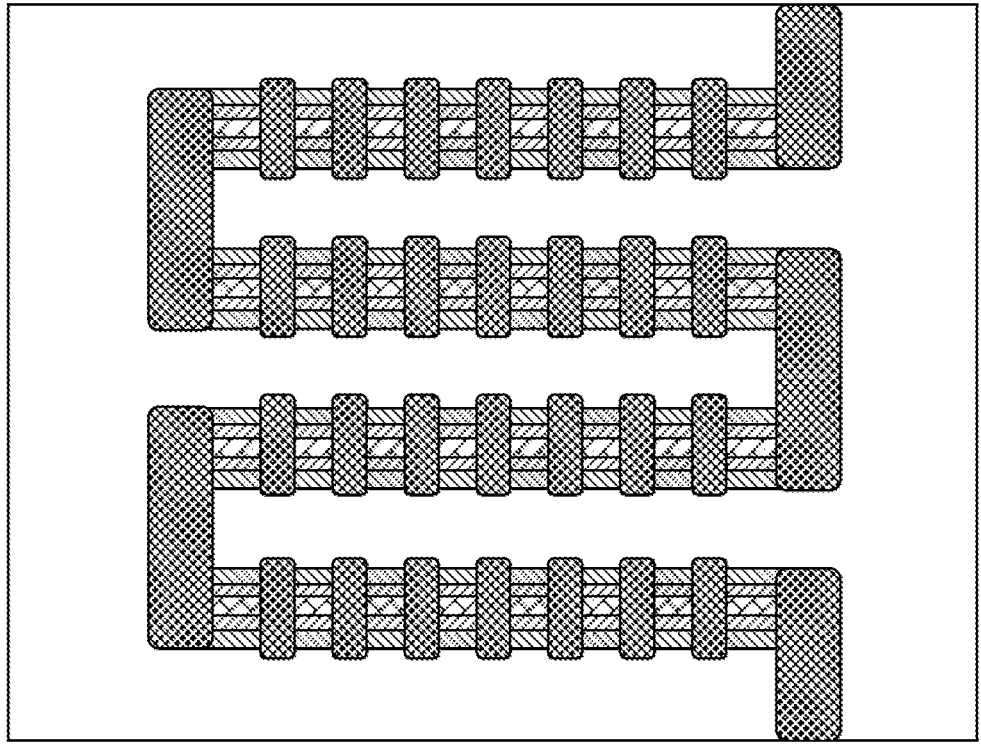
FIG. 8 is a schematic diagram of Step 7 of the first embodiment of the present invention.

By this step, the partition of the base structure body is formed by the strip trenches, isolation trenches and the isolation trench holes, which forms a staggered interdigitated structure on the base structure body. The interdigitated structure includes at least two fingers and a common connecting strip, each finger in the same interdigitated structure is connected to the commonly connecting strip in the interdigitated structure;

7) Filling the isolation trenches and isolation trench holes with insulating medium, as shown in FIG. 8.

In step 6), the isolation trench 71 encroaches into the first medium layer of the strip trench, or more preferably into the core medium layer, to ensure that the respective conductive media near the long sides of the strip trench are completely insulated and isolated.

In this embodiment, the possible combinations of the various medium layers involved are as follows. Each combination is an embodiment.

| | Conductive medium layer | First medium layer | Second medium layer | Core medium layer |
|---|---|---|---|---|
| Embodiment 1 | P+ type semi- | Insulating dielectrics | Lightly-doped N− type | N+ type semi- |

5

-continued

| | Conductive medium layer | First medium layer | Second medium layer | Core medium layer |
|---|---|---|---|---|
| | conductors | | semi-conductors | conductors or conductors |
| Embodiment 2 | N+ type semi-conductors or conductors | Lightly-doped N– type semi-conductors | Insulating dielectrics | P+ type semi-conductors |
| Embodiment 3 | P– type Schottky metals | Insulating dielectrics | Lightly-doped N– type semi-conductors | N+ type semi-conductors or conductors |
| Embodiment 4 | N– type Schottky metals | Insulating dielectrics | Lightly-doped P– type semi-conductors | P+ type semi-conductors or conductors |

The thickness of the insulating medium in the above table is preferably 0.5-5 nm.

The feature of the present invention is that the interdigitated structure consists of fingers and commonly connecting strips, where each finger in the same interdigitated structure is connected to the common connecting strip in the interdigitated structure. The two interdigitated structures are staggered and separated from each other. There is a plurality of independent memory bodies separated by insulators between the fingers, in which case the insulator is the insulating medium filled in the isolation trench holes. In each layer of the base structure, each memory body contains two memory units, as shown in FIG. 9. The memory unit is composed of the first medium, the second medium, and the core medium. The material of the first medium and the core medium meets the requirements of PN junction or Schottky structure. In FIG. 9, two memory units are shown with elliptical dashed lines.

The writing operation of the memory cell: A programming voltage is applied between the selected core dielectric layer and the selected conductive medium layer, and the programming voltage breaks down the first or second medium layer to complete the "write" operation.

Reading operation of the memory unit: the connection/disconnection state between the selected core medium layer and the selected conductive medium layer is detected, where it can be read out whether the first/second medium layer is broken down, that is, whether the data 0 or 1 is stored in the memory unit.

The second implementation: two layers of medium being in the strip trench.

The difference between this implementation and the implementation described above is that in this implementation, only two instead of three layers of medium layers are set in the strip trench, that is, the first medium layer and the core medium layer.

Figure 10:
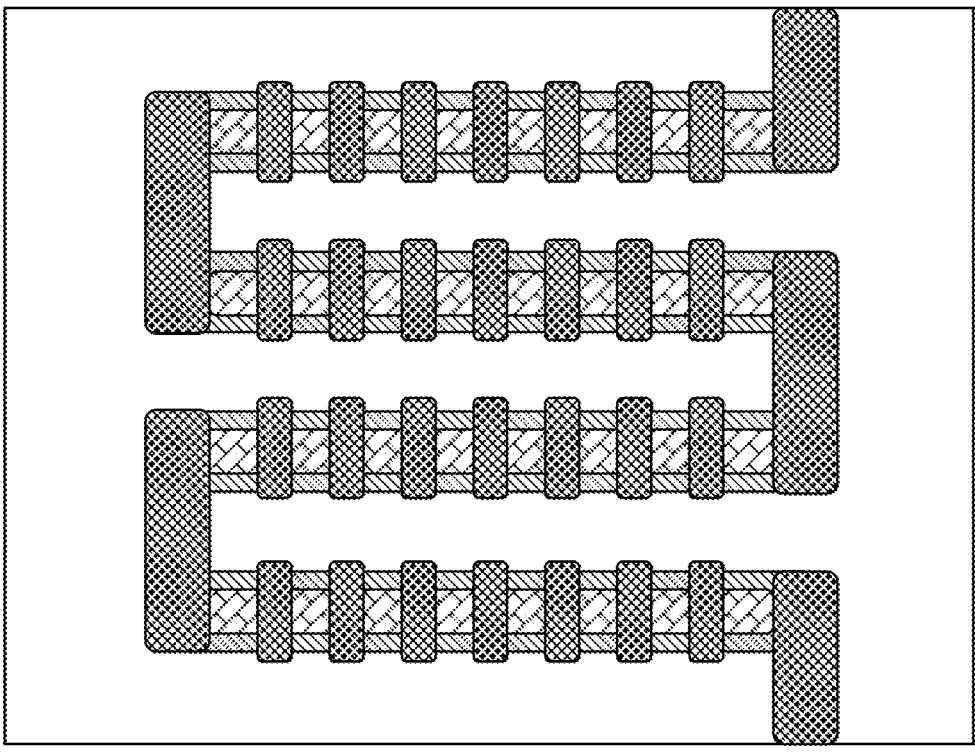
FIG. 10 is a schematic diagram of a 4-layer structure memory.

A schematic diagram of a memory fabricated by the process of this implementation is shown in FIG. 10. FIG. 11 is an enlarged schematic diagram of a single memory body.

The available combinations of the media involved are listed as follows. Each combination is an embodiment. The structures of Examples 5-9 are shown in FIGS. 10 and 11.

| | Conductive medium layer | First medium layer | Core medium layer |
|---|---|---|---|
| Embodiment 5 | P– type semiconductors | Insulating dielectrics | N– type semiconductors |
| Embodiment 6 | N– type | Insulating | P– type |

6

-continued

| | Conductive medium layer | First medium layer | Core medium layer |
|---|---|---|---|
| | semiconductors | dielectrics | semiconductors |
| Embodiment 7 | Schottky metals | Insulating dielectrics | Semiconductors |
| Embodiment 8 | Semiconductors | Insulating dielectrics | Schottky metals |
| Embodiment 9 | Conductors | Memory medium | Conductors |

The memory medium can be resistance change memory, magnetic phase change memory, phase change memory, or ferroelectric memory.

What is claimed is:

1. A fabrication method of a three-dimensional programmable memory, comprising the following steps:

1) forming a base structure, wherein a predetermined number of conductive medium layers and insulating medium layers are set in a way that the conductive medium layer and the insulating medium layer are vertically stacked one onto another to form the base structure;

2) trenching the base structure, wherein at least three strip trenches through from a top to a bottom of the base structure are independent and parallel from one to another, and adjacent sides of two strip trenches are long sides of at least three strip trenches;

3) on the inner wall of the at least three strip trenches, depositing memory medium layers determined by a preset memory structure layer by layer;

4) filling a core medium in a cavity of each strip trench to form a core medium layer;

5) setting isolation trenches and isolation trench holes to isolate left and right staggered partitions of the base structure and memory units, respectively, from a top layer to a bottom layer, wherein the isolation trenches encroach at least one memory medium layer at the at least three strip trenches, the isolation trenches together with the at least three strip trenches are connected from end to end to form a curve, the isolation trench holes extend continuously from one sidewall of each of the at least three strip trenches to an opposite sidewall of a same strip trench to divide the corresponding strip trench into at least three independent memory bodies and encroach the base structure near the long sides of the at least three strip trenches; and 6) filling the isolation trenches and isolation trench holes with insulating medium.

2. The fabrication method for the three-dimensional programmable memory according to claim 1, wherein the preset memory structure in the step 3) is one selected from the group:

a PN junction semiconductor memory structure, a Schottky semiconductor memory structure, a resistive memory structure, a magnetic variable memory structure, a phase change memory structure, and a ferroelectric memory structure.

3. The fabrication method for the three-dimensional programmable memory according to claim 1, wherein the preset memory structure is a PN junction semiconductor memory structure, the PN junction semiconductor memory structure includes a P-type conductive region, an N-type conductive region, and an insulating medium region between the P-type conductive region and the N-type conductive region; the conductive medium layer is a P-type semiconductor, and the core medium is an N-type semiconductor; or, the conductive medium layer is an N-type semiconductor, and the core medium layer is a P-type semiconductor; the step 3) further includes:

3.1 setting an insulating layer in each strip trench.

4. The fabrication method for the three-dimensional programmable memory according to claim 1, wherein the preset memory structure is a Schottky diode memory structure, the Schottky diode memory structure includes a semiconductor conductive region, a metal conductive region, and an insulating region set between the semiconductor conductive region and the metal conductive region; the conductive medium layer is a semiconductor required to form a Schottky diode structure, and the core medium layer is a metal required to form the Schottky diode structure; or, the conductive medium layer is a metal required to form a Schottky diode structure, and the core medium layer is a semiconductor required to form the Schottky diode structure; the step 3) further includes:

3.1 setting an insulating layer in each strip trench.

5. The fabrication method for the three-dimensional programmable memory according to claim 1, wherein the preset memory structure is a retentive medium memory structure, and the retentive medium memory structure is a resistance-change memory structure, a magnetic phase change memory structure, a phase change memory structure or a ferroelectric memory structure; materials of a conductive medium layer and a core medium layer are both metal or polysilicon; the step 3) further includes:

3.1 setting the memory medium layer in each strip trench.

6. The fabrication method for the three-dimensional programmable memory according to claim 1, wherein the preset memory structure is a PN junction semiconductor memory structure, the PN junction semiconductor memory structure comprises a P-type conductive region, an N-type conductive region, and an insulating medium region between the P-type conductive region and the N-type conductive region; the conductive medium layer is a P+ type semiconductor, and the core medium is an N+ type semiconductor or conductor; the step 3) further includes:

3.1 setting an insulating layer in each strip trench, 3.2 providing A lightly-doped N-type semiconductor layer is provided on an inner wall of the insulating layer; and 3.3 filling the core medium in the cavity of each strip trench with the insulating layer and the lightly-doped N-type semiconductor layer.

7. The fabrication method for the three-dimensional programmable memory according to claim 1, wherein the preset memory structure is a PN junction semiconductor memory structure, the PN junction semiconductor memory structure comprises a P-type conductive region, an N-type conductive region, and an insulating medium region between the P-type conductive region and the N-type conductive region; the conductive medium layer is an N+ type semiconductor or conductor, and the core medium is a P+ type semiconductor; the step 3) further includes:

3.1 setting a lightly-doped N-type semiconductor layer in each strip trench;

3.2 setting an insulating layer on an inner wall of the lightly-doped N-type semiconductor layer;

3.3 filling the core medium in the cavity of each strip trench with the insulating layer and the lightly-doped N-type semiconductor layer.

8. The fabrication method for the three-dimensional programmable memory according to claim 1, wherein the preset memory structure is a Schottky semiconductor memory structure, the Schottky semiconductor memory structure includes a metal conductive region, a semiconductor conductive region, and an insulating medium region between the P-type conductive region and the N-type conductive region; the step 3) further includes:

3.1 setting an insulating layer in each strip trench;

3.2 setting up a semiconductor layer on an inner wall of the insulating layer;

3.3 filling the core medium in the cavity of each strip trench with the insulating layer and the semiconductor layer; wherein the conductive medium layer is a metal required by a Schottky diode, and the semiconductor layer is a semiconductor required by the Schottky diode, and the core medium is a conductor.

9. The fabrication method for the three-dimensional programmable memory according to claim 1, wherein the isolation trenches encroach the at least three strip trenches to the core medium layer.

10. The fabrication method for the three-dimensional programmable memory according to claim 1, wherein the at least three strip trenches are rectangular, the isolation trench holes are rectangular, and long sides of the isolation trenches are perpendicular to the long sides of the at least three strip trenches.

* * * * *